(12) United States Patent
Cohen et al.

(10) Patent No.: US 8,316,174 B2
(45) Date of Patent: Nov. 20, 2012

(54) MICROCONTROLLER BASED FLASH MEMORY DIGITAL CONTROLLER SYSTEM

(75) Inventors: Daniel S. Cohen, Baltimore, MD (US); Matthew Todd Wich, Colorado Springs, CO (US); Jason J. Ziomek, Columbia, MD (US); Rocendo Bracamontes, Ellicott City, MD (US); Shude Lu, Woodstock, MD (US)

(73) Assignee: Atmel Corporation, San Jose, CA (US)

( * ) Notice: Subject to any disclaimer, the term of this patent is extended or adjusted under 35 U.S.C. 154(b) by 0 days.

(21) Appl. No.: 12/569,778

(22) Filed: Sep. 29, 2009

(65) Prior Publication Data

US 2010/0017563 A1      Jan. 21, 2010

Related U.S. Application Data

(63) Continuation of application No. 11/288,509, filed on Nov. 28, 2005, now Pat. No. 7,600,090.

(51) Int. Cl.
*G06F 12/00* (2006.01)
(52) U.S. Cl. .................. 711/103; 711/102; 711/167
(58) Field of Classification Search .................. None
See application file for complete search history.

(56) References Cited

U.S. PATENT DOCUMENTS

| | | |
|---|---|---|
| 5,072,418 A | 12/1991 | Boutaud et al. |
| 5,734,927 A * | 3/1998 | Boutaud et al. .......... 365/189.15 |
| 6,009,496 A | 12/1999 | Tsai |
| 6,154,788 A | 11/2000 | Robinson et al. |
| 6,246,634 B1 | 6/2001 | Nojima |
| 6,584,540 B1 | 6/2003 | Shinmori |
| 6,658,578 B1 | 12/2003 | Laurenti et al. |
| 6,754,765 B1 | 6/2004 | Chang et al. |
| 6,778,436 B2 | 8/2004 | Piau et al. |
| 2003/0067814 A1 | 4/2003 | Piau et al. |
| 2003/0079077 A1 | 4/2003 | Piau et al. |
| 2003/0131185 A1 | 7/2003 | Dover |
| 2004/0049627 A1 | 3/2004 | Piau et al. |
| 2005/0172065 A1 * | 8/2005 | Keays .......................... 711/103 |
| 2008/0040580 A1 | 2/2008 | Cohen et al. |

FOREIGN PATENT DOCUMENTS

| | | |
|---|---|---|
| WO | WO-2007062256 A2 | 5/2007 |
| WO | WO-2007062256 A3 | 5/2007 |

OTHER PUBLICATIONS

"U.S. Appl. No. 11/288,509, Notice of Allowance mailed May 11, 2009", 8 pgs.
"U.S. Appl. No. 11/288,509, Final Office Action mailed Jan. 28, 2009", 12 pgs.
"International Application Serial No. PCT/US2006/045564, Search Report and Written Opinion mailed Jul. 3, 2008", 15 pgs.
"U.S. Appl. No. 11/288,509, Non-Final Office Action mailed Jun. 18, 2008", 15 pgs.
"Taiwanese Application U.S. Appl. No. 095143902, Office Action mailed Feb. 27, 2009", 8 pgs.
"Chinese application No. 200680051923.3, Office Action mailed on Jul. 7, 2009", 1.

* cited by examiner

*Primary Examiner* — Shawn X Gu
(74) *Attorney, Agent, or Firm* — Fish & Richardson P.C.

(57) ABSTRACT

Some embodiments includes a digital control system having a microcontroller to handle a first command associated with a first operation of a memory device, and circuitry coupled to the microcontroller to handle a second command associated with a second operation of the memory device without involving the microcontroller in the second operation.

14 Claims, 3 Drawing Sheets

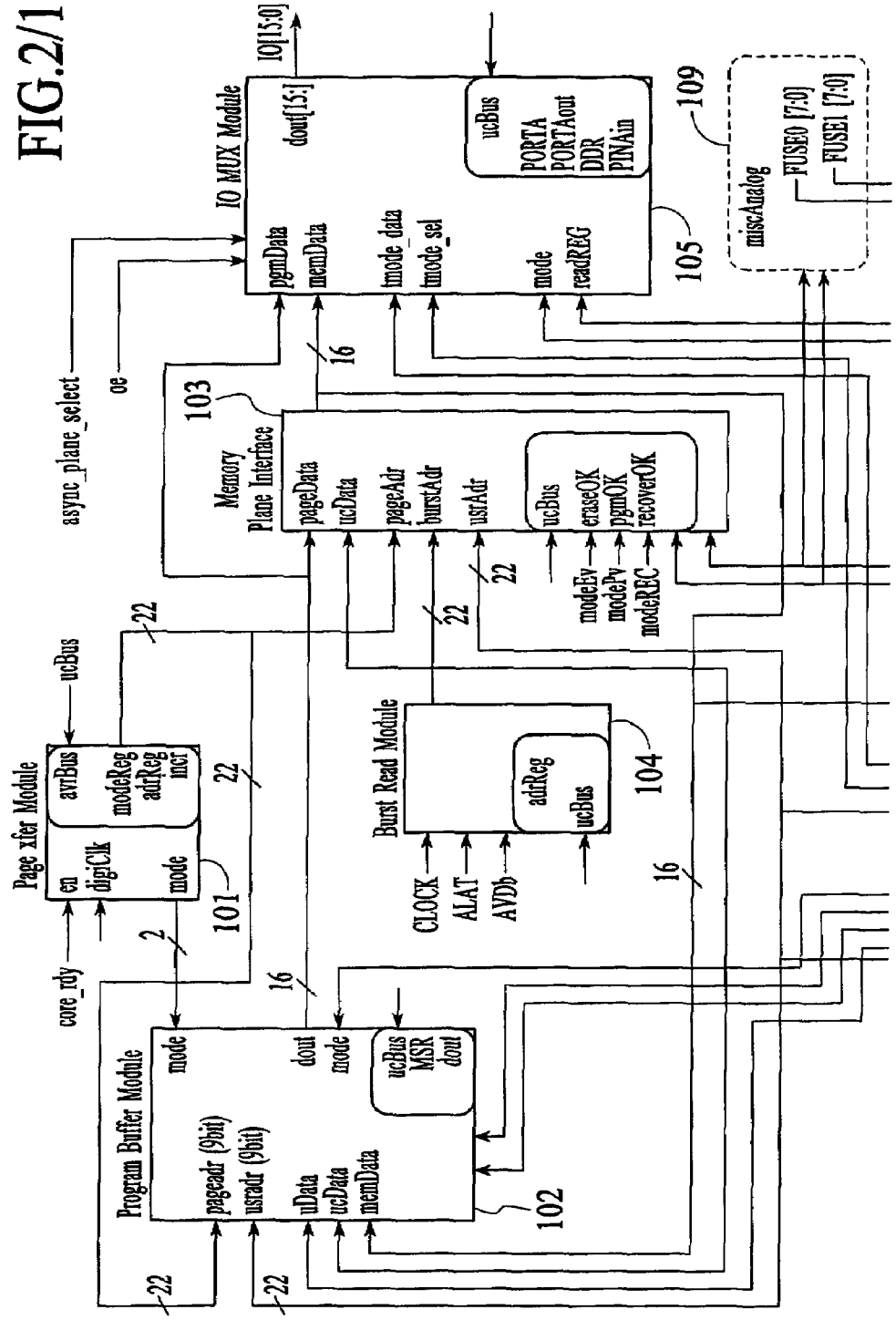
FIG.2/1

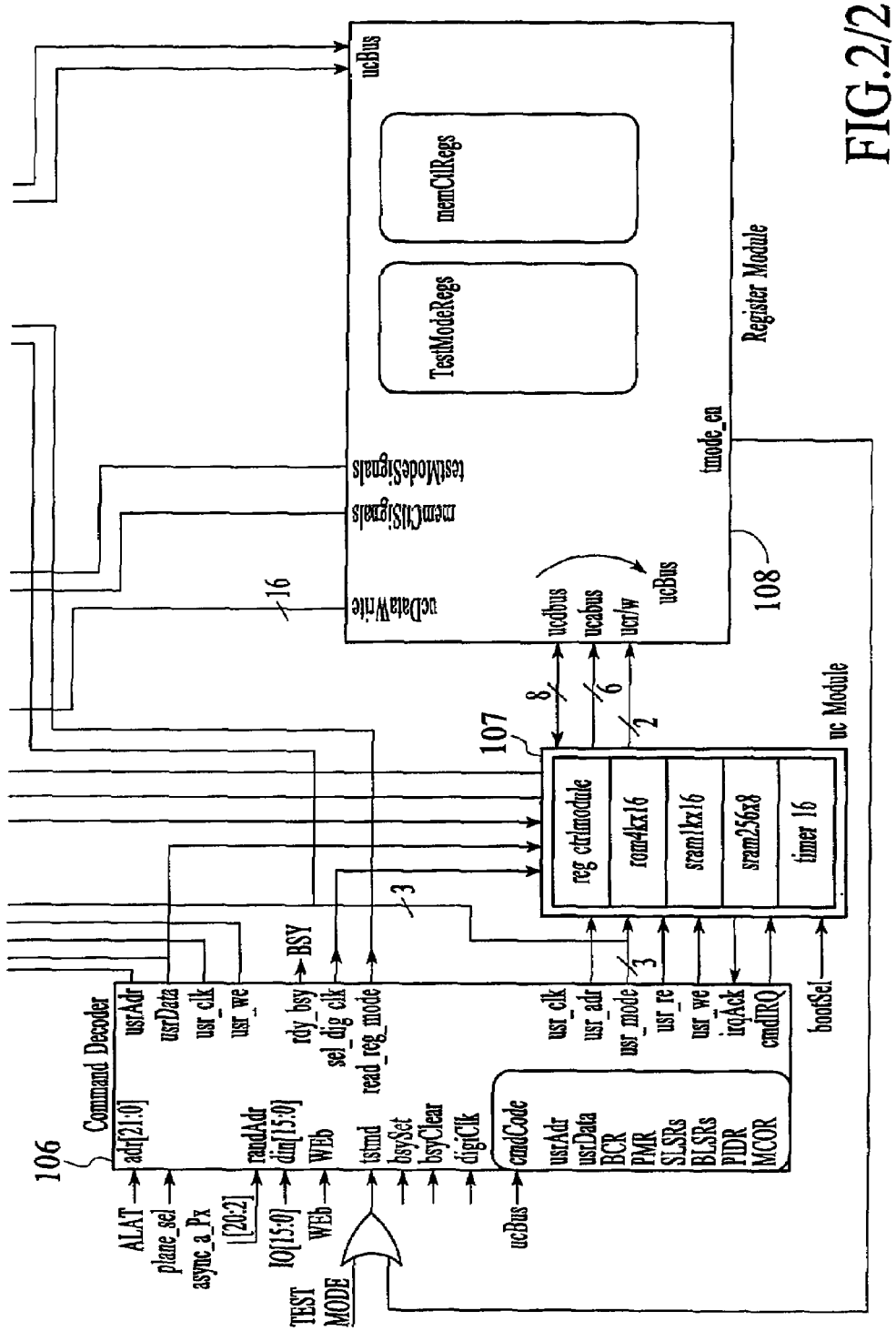
FIG.2/2

MICROCONTROLLER BASED FLASH MEMORY DIGITAL CONTROLLER SYSTEM

RELATED APPLICATIONS

This application is a continuation of U.S. application Ser. No. 11/288,509, filed on Nov. 28, 2005, issued Oct. 6, 2009 as U.S. Pat. No. 7,600,090, which is incorporated herein by reference in its entirety.

FIELD

The embodiments of the present invention relate to Flash memory digital controller systems, including microcontroller based flash memory digital controller systems.

BACKGROUND

The use of a digital controller system for the storage and retrieval of digital information to and from a non-volatile Flash memory module is known in the art. However, conventional digital controller systems use hardwired state machines, which are inflexible. The state machine would require recoding for any change in the algorithm.

Accordingly, there exists a need for an improved digital controller system. The improved digital controller system should be based on a standard microcontroller coupled to a separate command decoder and burst read controller. The embodiments of the invention address such a need.

BRIEF DESCRIPTION OF THE DRAWINGS

FIG. 2 illustrates in more detail the embodiment of the digital controller system in accordance with various embodiments of the present invention.

DETAILED DESCRIPTION

Figure 1:
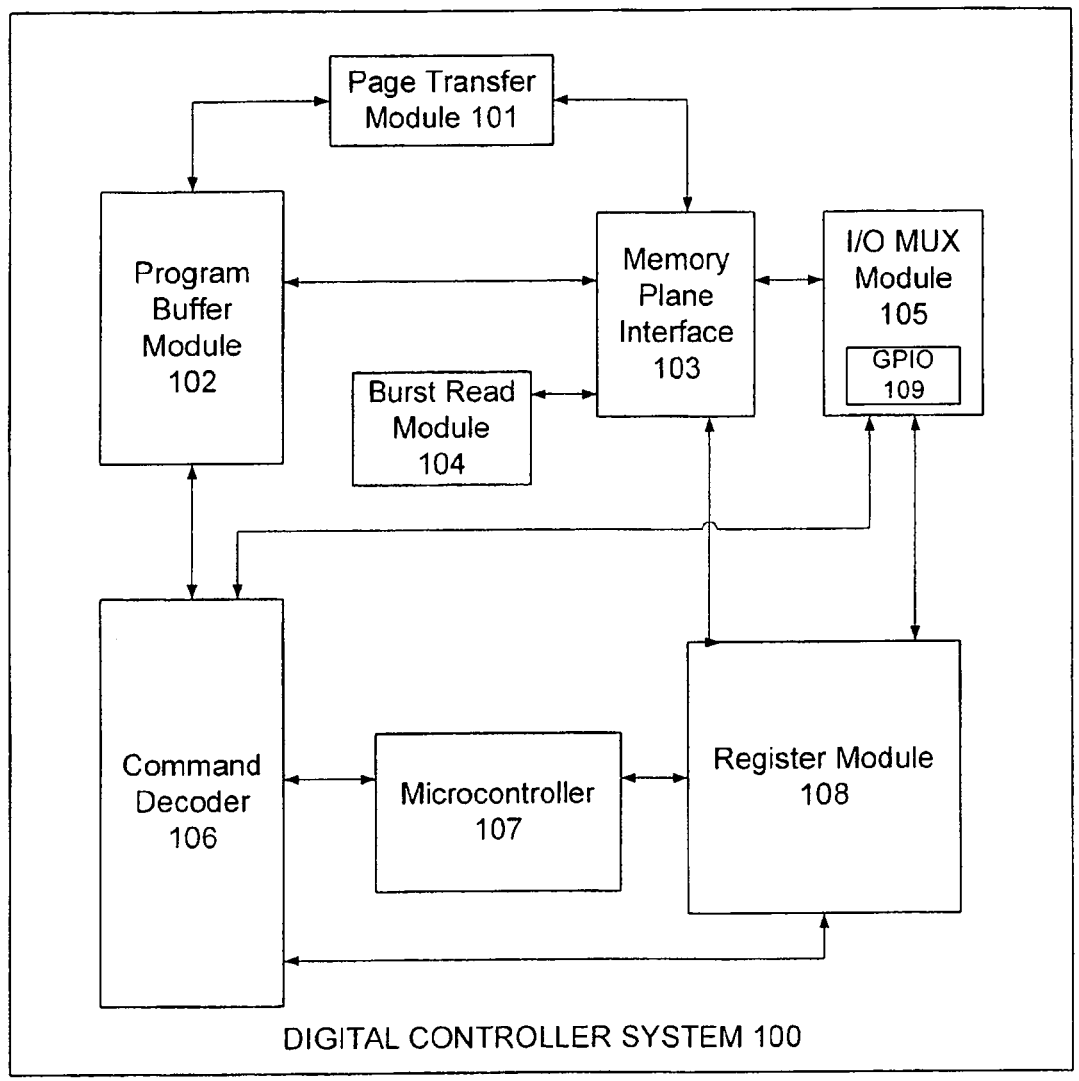
FIG. 1 illustrates an embodiment of a digital controller system in accordance with various embodiments of the present invention.

The following description is presented to enable one of ordinary skill in the art to make and use the embodiments of the invention and is provided in the context of a patent application and its requirements. Various modifications to the embodiments will be readily apparent to those skilled in the art and the generic principles herein may be applied to other embodiments. Thus, the embodiments of the invention are not intended to be limited to the embodiments shown but are to be accorded the widest scope consistent with the principles and features described herein.

The embodiments of the present invention provide a microcontroller based digital controller system. In some embodiments, a digital control system includes a microcontroller for handling timed events, a command decoder for interpreting user commands, a separate burst controller for handling burst reads of the Flash memory, a program buffer for handling page writes to the Flash memory, a page transfer controller for handling data transfers from the Flash core to the program buffer as well as address control for page writes from the program buffer to the Flash memory, a memory control register block for storing and adjusting memory control and memory test mode signals, a memory plane interface for multiplexing addresses into the Flash memory and accelerating program, erase, and recovery verification, and an I/O Mux module for multiplexing data out of the system, and a general purpose I/O port (GPIO) that can be read and written by the microcontroller for use in test and debug.

To more particularly describe the features of the embodiments of the present invention, please refer to FIG. 1 through FIG. 2 in conjunction with the discussion below.

FIG. 1 illustrates a preferred embodiment of a digital controller system in accordance with various embodiments of the present invention. FIG. 2 illustrates in more detail the preferred embodiment of the digital controller system in accordance with various embodiments of the present invention. The digital controller system 100 comprises a microcontroller 107. Separately from the microprocessor 107, the digital controller system 100 comprises a page transfer module 101, a program buffer module 102, a memory plane interface 103, a burst read module 104, an input/output (I/O) multiplexer (MUX) module 105, a command decoder 106, and a register module 108, the functions of which are further described below.

In the preferred embodiment, the non-volatile Flash memory module can be embedded in or external to the digital controller system 100. Further in the preferred embodiment, the digital controller system 100 is built around a standard microcontroller system 107, but having additional "intelligence" built into the command decoder 106. The command decoder 106 serves to provide a means for detecting and managing user commands and waking up the microcontroller 107 when the command requires a complex "timed" command. The burst read module 104 provides a means of detecting a burst read request and responding accordingly. A "timed" command, as used in this specification, is a command which cannot be executed in one cycle, but rather requires a series of events to occur in order for the command to be fully executed. Examples of timed events include programming and erasing the Flash memory, setting or clearing non-volatile lock bits, page transfers from the Flash memory to the program buffer, and various test mode and extended commands. The use of a standard microcontroller 107 to handle timed events provides flexibility that is not offered by hardwired state machines. If the algorithm for interfacing to the Flash memory module needs to be tweaked, it can be done more readily by a simple mask change to the ROM that stores the microcontroller's firmware.

The Command Decoder

The command decoder 106 serves as a user interface, allowing commands to be received and managed independently of the micro controller 107. The command decoder 106 serves as a "traffic cop" for the digital controller system 100 and acts on legal commands and ignores illegal ones. When a command is acted on, it is either done so solely by the command decoder 106 or by waking up the microcontroller 107. An example of a command not requiring the use of the microcontroller 107 is a read command, or write to the burst control register, or soft/hard lock registers. An example of a command requiring the use of the microcontroller 107 is a program or erase, or any other timed command.

Having a command decoder 106 separate from the microcontroller 107 providers several advantages:

(1) The microcontroller 107 can be turned off or put to sleep when there is no timed event underway. This saves power which is vital in low power battery operated systems.

(2) The microcontroller 107 need not be concerned with new commands, command prioritization, or management while it is working on a command. This provides code efficiency and allows for quicker processing of timed events which is crucial for quick programming and erasing of the Flash memory, a key metric of competitiveness.

(3) Interrupts are generated should an "erase suspend" command be issued while the microcontroller 107 is busy processing an erase command.

(4) The command clock is decoupled from the microcontroller clock, allowing the micro controller 107 to run at a set speed asynchronously to the clock of the system 100 where the digital controller/Flash module will be used. This also allows quick responses to user commands even where multi-cycle timed events will occur. The ready signal can be dropped instantly by the command decoder 106 despite the fact that it could take some time for the microcontroller 107 to recognize the command.

(5) Software extendable commands are provided, whereby a single command called "the extended command" is interpreted along with an opcode that the command decoder 106 stores into a separate opcode register. When this command is received, the microcontroller 107 is awoken and knows to look at the opcode register. Depending on the value of the opcode, the firmware will adapt its behavior. By using an 8-bit opcode register, this method provides up to 256 additional commands.

(6) The microcontroller 107 serves as a test interface to the digital controller system 100 that provides for:

(a) User observability of the microcontroller's program counter (address counter) that can be used to determine what the micro controller 107 is doing at any given time. This can be particularly helpful should the firmware hang or an intermittent bug occurs. This function is limited by the fact that it is ignored during boot (initialization). A means around this limitation is provided by firmware that polls an input during initialization to determine if the user wants to put the device to sleep.

(b) Access to all the registers on the microcontroller's data bus while the micro controller 107 is asleep. This feature can be very useful in determining the state of the system 100 should a problem be detected. This is accomplished by having the command decoder 106 take control of the microcontroller's address and databus during a specific test mode. This mode can only be entered when the micro controller 107 is asleep. This prevents any contention on the buses. A central bus multiplexing unit located in the block containing the micro controller 107 outputs a single address bus and clock such that the registers on the bus needs not be aware that this debug mode exists. They simply respond to the clock and address as normal, not knowing whether the true source is the firmware acting through the micro controller 107 or the user acting through the command decoder 106.

(c) Putting the microcontroller 107 to sleep should it be necessary to debug the state of the system 100 at any given time.

The Burst Read Module

The burst read module 104 contains a state machine for interpreting burst read commands, and counters for addressing the Flash memory, which serves to provide hardware acceleration for the burst read function. This is critical since the burst read function must operate at a significantly higher speed than normal asynchronous reads. The burst read module 104 also controls the initial access time of the burst read data by controlling the initial latency between the latching of the starting address and the raising of the data valid signal. This functionality creates a general purpose microprocessor interface to the Flash memory, preventing the microcontroller 107 from having to become involved in the read operation.

The burst read module 104 also prevents the burst address from entering a busy plane in the Flash memory by looking at a stop/busy signal and allowing the address counter to finish counting through the current 64-bits of data before stopping.

In the preferred embodiment, the external interface to the user contains a 16-bit data word, however, to support high burst speeds, 64-bits are read at a time. While the four 16-bit words are being multiplexed out, the next 64 bits are being read. This eliminates the read latency after the initial latency and allows the burst function to operate at a higher data rate. The burst read module 104 also provides the burst enable signal and address to the memory plane interface 103, which in turn handles the multiplexing of the address into the Flash memory depending on the type of operation that is occurring. In the case of a burst read, the burst address will be multiplexed in.

Page Transfer Module

The page transfer module 101 contains a counter for addressing the Flash memory and the program buffer module 102. This provides hardware acceleration of the page transfer function, where a page of data is copied from the Flash memory to the program buffer module 102. By having its own counter and a microcontroller addressable "done" signal, the firmware can initiate a page transfer and then simply poll the "done" signal to know when the transfer has completed. This saves many cycles of firmware controlled address incrementation and data read/writes. Further, the program buffer module 102 pre-set function can be done quickly by setting a data register to a known value and then simply counting through the page address as the data register is written to all locations. This saves valuable code space and firmware developer effort.

Program Buffer Module

The program buffer module 102 contains a one page (4 Kbit or 256 16-bit words) byte addressable SRAM that serves as a page buffer for programming into the Flash memory. In the preferred embodiment, the program buffer module 102 has a logical size of 256×16 and is physically composed of two 256×8 bit SRAMs, making it possible to easily support byte addressing. It can be addressed by the user, by the command decoder 106, or by the firmware through the page transfer module's 101 address counter, allowing it to be read and written by both the user and the firmware. It also contains a status register that keeps track of which segment has been written to. In the preferred embodiment, there are 16 bits per word, 256 words per page and 32 words per segment. Therefore, there are 8 segments per page. The status register is 8 bits wide with each bit representing one of the 32 segments.

Memory Plane Interface

The memory plane interface 103 handles the multiplexing of address buses from different sources into the Flash memory module so that it can be accessed by the user (in the case of random reads), the burst read module 104 (in the case of burst reads), the firmware (for program and verify functions), and/or the page transfer module 101 (for copying data from the Flash memory to the program buffer) module 102. Separating the memory interface into its own hierarchical unit makes it possible to have a clean address interface that is optimized for performance by prioritizing the burst address bus for high speed reads and by making it easier to minimize skew on the address buses, which is critical for low power operation of the asynchronous Flash memory.

In addition, the memory plane interface 103 contains novel circuitry that performs the following three functions that serve as hardware accelerators to the program and erase functions:

(1) Program Okay Function: As data is stored into the Flash memory, it is simultaneously read back out and compared to the data that is being programmed. If the data does not match, a new pattern is generated that contains 0's only in the bit locations that need additional programming pulses. A bitwise AND of this pattern is assigned to a firmware readable register called "program_okay". If program_okay is LOW, then the new pattern must be programmed into the memory. If program_okay is HIGH, then no further programming is necessary.

(2) Erase Okay Function: A bitwise AND of the 64-bit data at the current address is stored in a firmware readable register called "erase_okay". Since an erased bit in the Flash memory is actually represented as a HIGH, this bit will indicate if all the bits in the 64 bit word are erased. A LOW value of erase_okay indicates to the firmware that additional erasing is necessary.

(3) Don't Recover Function:

(a) don't_recover_64 register: As noted previously, in the preferred embodiment, 64 bits (4 words) are read at a time. This allows the high speed burst read function to work. It should be noted that the 64 bit read is arbitrary and is only limited by the need for additional circuitry and power that would be required to read more bits at a time. When an erase is performed on a bit, it must be followed by a recover operation to ensure that the bit was not erased "too much". All over-erased bits must be recovered (soft programmed).

As firmware steps through addresses, the don't_recover_64 register will be set by hardware. A HIGH value indicates that no bit in the 64 bit slice are erased and therefore no recover (soft programming) is necessary. A LOW value indicates that at least one bit in the slice is in the erased state and therefore recovery is necessary. The firmware will then step through the addresses of the four 16-bit words that form this 64 bit slice and examine the don't_recover register to narrow down where to actually do the recovery.

(b) don't recover register: Whereas the don't_recover 64 register is formed by examining the contents of a 64-bit slice, the don't_recover register is formed by just 16 bits. Because the smallest range of bits that can be recovered at a time is 16 bits, it is code and time efficient to further narrow down the 64 bit slice into 16-bit words and perform the recovery at this scope.

Register Module

The register module 108 contains registers whose values are loaded during the firmware initialization routine and whose purpose is to control or tweak various trim settings on the Flash memory and its analog support components. Various memory control signals are derived from individual bits or combination of bits in these registers. Some of these registers are for test while others are for normal operation. Examples include: enabling/disabling various steps during program and erase; trim values for various charge pumps used during read and program; oscillator frequency trim; and bandgap trim for controlling analog voltage regulation.

The register module 108 also contains some status registers or flags that are used by the firmware. These include the "error bit" that is set when a programming or erase error occurs, the suspend status register which indicates if an erase command has been suspended, and the "POR_init" register which indicates a Power On Reset has occurred.

The POR_init bit offers the advantage of allowing the firmware to make a decision as to whether the part is powering up in which case a full initialization is necessary, or whether the reset has occurred simply from a user initiated reset in which a significantly shorter initialization routine is used. This allows for faster boot up making a more competitive device.

The suspend status register offers advantages for the erase suspend and erase resume operations. Since an erase command involves many steps depending on the size of the data being erased, it is advantageous to keep track of how far along in the sequence the command has progressed so that if it is interrupted by a suspend command, the firmware can later know where to pick up again when the command is resumed. The 8-bit suspend status register serves this purpose. As the firmware progresses through an erase command, it keeps track of each step in the SSR. When an erase resume command is issued, the firmware looks at the SSR to know what has already been done so that it needn't re-run completed steps. The POR_init and error bit registers are cleared by signals from the command decoder 106.

I/O Mux Module

The I/O Mux module 105, accessible by the firmware, multiplexes data out of the system 100. It comprises a general purpose I/O (GPIO) 109 which provides advantages during debug and evaluation. In the preferred embodiment, a four bit I/O is used due to size limitations on the die that didn't allow enough space for a full 8 bit I/O that would have matched the microcontroller's data bus. However, firmware can output the first four bits of the bus and then the next four bits on a separate cycle. The I/O is bi-directional and can be used by the firmware to read as well as write. Since the system 100 has a special instruction SRAM for running firmware out of RAM instead of ROM during debug and evaluation, the firmware can be modified as necessary during debug of firmware or hardware. The GPIO 109 can be of immense help during this process.

An improved digital control system has been disclosed. The system comprises multiple subsystems including a microcontroller for handling timed events, a command decoder for interpreting user commands, a separate burst controller for handling burst reads of the Flash memory, a program buffer for handling page writes to the Flash memory, a page transfer controller for handling data transfers from the Flash core to the program buffer as well as address control for page writes from the program buffer to the Flash memory, a memory control register block for storing and adjusting memory control and memory test mode signals, a memory plane interface for multiplexing addresses into the Flash memory and accelerating program, erase, and recovery verification, and an I/O Mux module for multiplexing data out of the system, and a general purpose I/O port (GPIO) that can be read and written by the microcontroller for use in test and debug.

Although the embodiments of present invention have been described in accordance with the embodiments shown, one of ordinary skill in the art will readily recognize that there could be variations to the embodiments and those variations would be within the scope of the present invention. Accordingly, many modifications may be made by one of ordinary skill in the art without departing from the spirit and scope of the appended claims.

What is claimed is:

1. A system comprising:
a microcontroller configured to handle a first command associated with writing data into a memory device and configured to handle a second command associated with erasing data in the memory device, the second command being different from the first command; and
circuitry coupled to the microcontroller that is configured to handle an additional command associated with an additional operation of the memory device without involving the microcontroller in the additional operation, the microcontroller being in a sleep mode when the additional command is present, wherein the circuitry is configured to wake up the microcontroller when the second command is present.

2. The system of claim 1, wherein the additional operation includes a read operation to retrieve data from the memory device.

3. The system of claim 1, wherein the circuitry includes a decoder configured to interpret the first, second and additional commands.

4. The system of claim 1, wherein the memory device includes a non-volatile memory device.

5. The system of claim 4, wherein the microcontroller is further configured to set lock bits associated with the non-volatile memory device.

6. The system of claim 4, wherein the microcontroller is further configured to clear lock bits associated with the non-volatile memory device.

7. The system of claim 1 further comprising a memory configured to store firmware of the microcontroller, the firmware configured to be changed in order to change an algorithm for interfacing the memory device.

8. The system of claim 7, wherein the memory to store firmware includes a read-only memory (ROM).

9. The system of claim 1 wherein the microcontroller is turned off or put in a sleep mode when the circuitry handles the additional command associated with the additional operation of the memory device.

10. A system comprising:
    a microcontroller configured to handle a first command associated with writing data into a non-volatile memory device and configured to handle a second command associated with erasing data in the non-volatile memory device, the second command being different from the first command; and
    circuitry configured to handle an additional command associated with an additional operation of the non-volatile memory device, the circuitry including a module to control an initial latency between a latching of a starting address in the non-volatile memory device and rising of a data valid signal during the additional operation, wherein the circuitry is configured to handle the additional command without involving the microcontroller in the additional operation, the microcontroller being in a sleep mode when the additional command is present, and wherein the circuitry is configured to wake up the microcontroller when the second command is present.

11. The system of claim 10, wherein the additional operation includes a burst read operation to retrieve data from the non-volatile memory device.

12. A method comprising:
    handling a first command using a microcontroller included in a system, the first command associated with writing data into a memory device;
    handling a second command using the microcontroller, the second command associated with erasing data in the memory device, the second command being different from the first command;
    handling an additional command associated with an additional operation of the memory device, wherein the additional command is handled by circuitry of the system without involving the microcontroller, the microcontroller being in a sleep mode when the additional command is present; and
    waking up the microcontroller by the circuitry when the second command is present.

13. The method of claim 12 further comprising:
    performing a read operation based on the additional command to retrieve data from the memory device.

14. The method of claim 13 further comprising:
    performing a change to a read-only memory (ROM) that stores firmware of the microcontroller, wherein performing the change to the ROM is based on algorithm for interfacing the memory device.

* * * * *

UNITED STATES PATENT AND TRADEMARK OFFICE
CERTIFICATE OF CORRECTION

PATENT NO. : 8,316,174 B2
APPLICATION NO. : 12/569778
DATED : November 20, 2012
INVENTOR(S) : Daniel S. Cohen Page 1 of 1

It is certified that error appears in the above-identified patent and that said Letters Patent is hereby corrected as shown below:

On the title page, line 5, (75) Inventors: please delete "Matthew" and insert therefor -- Mathew --; and Column 5, line 31, please delete "don't recover" and insert therefor -- don't_recover --.

Signed and Sealed this
Fifth Day of February, 2013

Teresa Stanek Rea
*Acting Director of the United States Patent and Trademark Office*